United States Patent [19]

Rediker

[11] Patent Number: 4,479,224
[45] Date of Patent: Oct. 23, 1984

[54] FIBER-COUPLED EXTERNAL CAVITY SEMICONDUCTOR LASER

[75] Inventor: Robert H. Rediker, Watertown, Mass.

[73] Assignee: Massachusetts Institute of Technology, Cambridge, Mass.

[21] Appl. No.: 315,145

[22] Filed: Oct. 26, 1981

[51] Int. Cl.$^3$ .............................................. H01S 3/05
[52] U.S. Cl. ........................................ 372/92; 372/44; 372/50
[58] Field of Search .................... 372/44, 45, 46, 50, 372/92, 97, 98, 103; 350/96.15, 96.16, 96.17

[56] References Cited

U.S. PATENT DOCUMENTS 4,246,548  1/1981  Rutz ..................................... 372/50

OTHER PUBLICATIONS

I. Ikushima & M. Maeda, "Lasing Spectra of Semiconductor Lasers Coupled to an Optical Fiber", IEEE Journal of Quantum Electronics, vol. QE-15, No. 9, Sep. 1979, pp. 844–845.
Elisabeth M. Philipp-Rutz, "Spatially Coherent Radiation from an Array of GaAs Lasers", Applied Physics Letters, vol. 26, No. 8, Apr. 15, 1975, pp. 475–477.
Mark Walter Fleming, "Spectral Characteristics of External-Cavity-Controlled Semiconductor Lasers", PhD. Thesis, M.I.T., Cambridge, MA, Jun. 1980.

Primary Examiner—James W. Davie
Attorney, Agent, or Firm—Arthur A. Smith, Jr.; Thomas J. Engellenner

[57] ABSTRACT

An external cavity semiconductor laser includes an array of semiconductor optical gain elements, each device having at least one transmissive facet along an optical axis, and reflectors for reflecting incident light from the laser devices back to those devices. Optical fibers couple the transmissive facets of the optical gain elements in parallel to the reflectors. A spatial filter in the cavity between the optical gain element array and the reflectors establish spatial coherence of the light within the cavity to establish a coherent output beam. In this form, the fiber-coupled laser devices may be located in remote sub-groups, thereby reducing the power dissipation density for the external cavity laser.

8 Claims, 2 Drawing Figures

FIBER-COUPLED EXTERNAL CAVITY SEMICONDUCTOR LASER

The Government has rights in this invention pursuant to Contract Number AF19(628)-80-C-0002 awarded by the U.S. Department of the Air Force.

FIELD OF THE INVENTION

The present invention is in the field of semiconductor lasers, and more particularly, in the field of external cavity semiconductor lasers.

BACKGROUND OF THE DISCLOSURE

Semiconductor lasers have been developed rapidly in recent years. There are however many potential applications of such lasers, such as satellite-borne operation, where reliability and power conversion efficiency limitations have generally prevented their use.

Relatively recent developments of semiconductor lasers have resulted in the increasing availability of high reliability devices, for example, with lifetimes as high as $10^6$ hours. Moreover, while certain populations of such devices have been determined to have a high infant mortality rate, the devices can be screened out so that the remaining devices in those populations are characterized by a substantial uniform long life, for example, (on the order of 100–1,000 years) life.

In addition, the recently developed semiconductor lasers, although relatively low power, have been becoming relatively inexpensive, highly power efficient, and controllable in terms of wavelength selectivity.

Generally, semiconductor lasers have reached the point where even large arrays of such lasers can be highly reliable and characterized by a relatively high efficiency power conversion, while maintaining a relatively low cost per laser. U.S. Pat. No. 4,246,548 and Phillip-Rutz, E.M., "Spatially Coherent Radiation From an Array of GaAs Lasers", Applied Physics Letters, Vol. 26, No. 8, April 1975, pp. 475–477, each disclose an external cavity laser including a monolithic array of laser diodes. As a result of the close proximity of the laser diodes in the monolithic array structure, the power dissipation density of these configurations is substantially limited. There are no prior art known approaches to overcome this power dissipation density limitation in coupling large numbers of relatively low power semiconductor laser devices to produce a relatively high power (for example, on the order of 1 kW), coherent optical beam.

It is an object of the present invention to provide an external cavity semiconductor laser for producing a high power, coherent optical laser beam.

SUMMARY OF THE INVENTION

Briefly, the present invention is an external cavity laser. The laser includes an array of semiconductor optical gain elements, where each element in the array includes a pair of opposing end facets lying along an optical axis, and at least one of which is substantially transmissive. These devices semiconductor optical gain elements may be for example relatively low power semiconductor laser devices. In the preferred form, the transmissive facets have an anti-reflective coating.

A first reflector is adapted to reflect light from the transmissive facets back to those transmissive facets. A second reflector is adapted to reflect light from the other facets back to those other facets. The second reflector may have the form of individual reflectors associated with the respective gain elements. In this form, the second reflector for each gain element may be integral with the other facets of that gain element, and light within the optical gain element passing along the optical axis and incident on the other facet, is reflected in the associated direction along the optical axis. The first and second reflectors thereby establish an optical propagation path between them.

A first bundle of optical fibers includes at least one optical fiber associated with and coupled to the transmissive facet of one of the gain elements in the array. The other end of the respective optical fibers are oriented with their optical axes substantially mutually parellel. The end of the fiber bundle which is adjacent to the array of optical gain elements is referred to herein as the laser end, and the other end of the fiber bundle is referred to herein as the cavity end. The fibers in the first bundle establish a portion of the optical propagation path between the transmissive facets and the first reflector. At the cavity end, the optical axes of the fibers are substantially parallel to the propagation path at that point.

In some embodiments, where both facets of the gain elements are transmissive, a second bundle of fibers similar to the first bundle may establish a portion of the propagation path between the other facets of the gain elements and the second reflector. The propagation path length between the first and second reflectors is substantially equal to an integral number of wavelengths of the light generated by the respective gain elements.

A spatial filter is positioned along the propagation path between the cavity end of the fiber bundle and the first reflector. The spatial filter receives light from the cavity end of the fiber bundle and transmits that light to the first reflector. In addition, the spatial filter receives light from the first reflector and transmits that light to the cavity end of the fiber bundle. In general, the spatial filter includes a pair of coaxial collimating lenses having optical axes parallel to the propagation path and which are separated by the sum of the focal length of the lenses. A filter element is positioned between the lenses substantially at the mutual focal point of the lenses. The filter element is matched to the Fraunhofer interference pattern associated with the array of fibers at the cavity end of the fiber bundle. The spatial filter is matched to the interference function of the array of gain elements so with this configuration, that the light between the first and second reflectors is spatially coherent. An output coupler taps a portion of this coherent light from the cavity to provide a relatively high power, coherent output beam.

In some forms of the invention, the fiber bundle includes associated devices which control the effective optical path length for one or more of the optical fibers. In this manner, the optical path length within the cavity may be effectively trimmed for the various gain elements in the array.

The use of the fiber bundle along the optical path between the transmissive ends of the gain elements and the spatial filter permits the gain elements to be positioned remote from the "cavity", thereby permitting reduced power dissipation density in the cavity.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
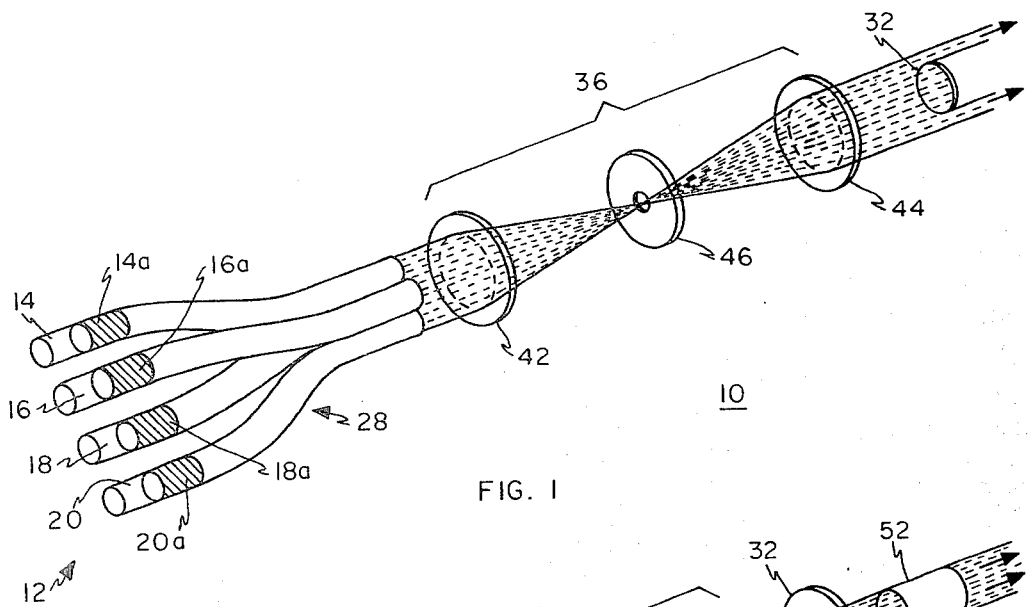
FIGS. 1 and 2 show exemplary embodiments of the invention.

FIG. 1 shows a fiber coupled external-cavity semiconductor laser 10 in accordance with the present invention. Laser 10 includes an array 12 of optical gain elements (e.g. semiconductor laser devices such as Hitachi HLP 1400 laser diodes), all tuned to the same optical frequency, and a cavity reflector 32. In the illustrated embodiment, the array 12 includes four laser devices 14, 16, 18 and 20.

Each laser device in the array 12 includes a wholly reflective end and an anit-reflection coated transmissive end.

A bundle 28 of optical fibers is positioned in the cavity between array 12 and reflector 32. In the preferred form of the invention, the fibers are single mode, although multi-mode fibers may also be used. The bundle 28 includes an optical fiber associated with each of the laser devices in the array 12. Each fiber has one end coupled to its associated laser device. The opposite ends of the fibers are aligned so that their optical axes are mutually parallel. The end of bundle 28 at which the fiber optical axes are parallel is referred to the cavity end of the bundle. By way of example, the fibers may be type Corning 4834 single mode fibers with a 9 mm core.

Reflector 32 is adapted to reflect light incident thereon from the cavity end of the fiber bundle 28 back to that cavity end. The reflector 32 is positioned so that for each laser device, the optical path length (from the wholly reflective end of that laser device, through its associated optical fiber, to the reflector 32, and then back through its fiber to the reflective end of that laser device) is substantially equal to an integral number of wavelengths of the light generated by that laser device.

In the embodiment shown in FIG. 1, the reflector 32 is a flat mirror. The size of this mirror, relative to the beam width within the cavity, determines the output coupling for the laser 10.

A spatial filter 36 is positioned between the cavity end of the fiber bundle 28 and the reflector 32. The spatial filter is adapted to receive light from the cavity end of the fiber bundle 28 and transmit that light to the reflector 32. The filter also receives light reflected back from the reflector 32 and transmits that light toward the cavity end of fiber bundle 28. Spatial filter 36 is matched to the interference function of the array of lasers so that the light at the cavity end of the fiber bundle 28 is spatially coherent. In general, the spatial filter includes a pair of coaxial collimating lenses having optical axes parallel to the propagation path and which are separated by the sum of the focal length of the lenses. A filter element is positioned between the lenses at the mutual focal point of the lenses. The filter element is matched to the Fraunhofer interference pattern associated with the array of fibers at the cavity end of the fiber bundle.

As shown in FIG. 1, the spatial filter 36 includes collimating lenses 42 and 44 and an intermediately positioned annular stop member 46. In the preferred form, the lenses are anit-reflection coated. The optical axes of lenses 42 and 44 and stop member 46 are substantially parallel to the fiber optical axes at the cavity end of bundle 28. In effect, the stop member 46 provides the spatial filtering, while the lenses 42 and 44 serve to collimate and re-collimate the beam between the cavity end of bundle 28 and the reflector 32. In other embodiments, differing spatial filter configurations may be used.

In other embodiments, the spatial filter 36 may be implemented by the insertion of reflective strips at positions where maxima in the interference pattern would occur if the elements of the array were coherent. This technique is disclosed in the above noted article and patent.

In the present embodiment, the reflector 32 is a circular flat mirror. Consequently, the output beam from laser 10 has an annular cross-section about the obscuration of the mirror 32. The output coupling for laser 10 is determined by the ratio of the outer and inner radii of the annulus by the relationship $(R_o^2-R_i^2)/R_o^2$, where $R_o$ is is the outer radius of the beam in the plane of mirror 32 and $R_i$ is the radius of mirror 32. Alternatively, a partially reflective (such as 40% reflective) mirror may be used for reflector 32 and the output coupler.

The embodiment of FIG. 1 shows an exemplary embodiment including an array of four semiconductor laser devices 14, 16, 18 and 20 coupled in parallel. The invention may alternatively be embodied with laser arrays having many more semiconductor laser devices. For example, average power on the order of 1 kw may be achieved using $10^5$ lasers and a fiber bundle having a corresponding number of fibers.

By way of example, the laser devices in the array may be semiconductor laser devices having active regions including $Ga_xAl_{1-x}As$, which lases at room temperature at wavelengths between 820 nm and 904 nm. In alternative embodiments, semiconductor laser devices of the array may have active regions of the quaternery compound $In_xGa_{1-x}As_{1-y}P_y$ may be used to lase at wavelengths between 904 nm and 1.5 um, for example, to be optimally matched to conventional optical fibers, which have minimal attenuation (on order of 1 db/km) at 1.3 or 1.5 um, or to lase at 980 nm which is desired for doubling into the blue-green at 490 nm.

With this configuration, the exact frequency at which the fiber-coupled external cavity laser 10 will lase is determined by the external cavity. The elements which support the laser device array and the reflector, which define the cavity may be constructed with superinvar spacers, to provide a relatively stable output wavelength. The reflectors may be supported by piezoelectric elements facilitate permit fine tuning of their position.

The reflector 32 may comprise a grating used in the Littrow configuration (rather than a mirror 32) to provide advantages in selecting wavelength. In this form, a narrow-band first order beam is returned. This return beam is colinear with the incident beam. By way of example, the grating may have a ruling of 1200 lines/min and be blazed to return over 90 percent of the incident light. Diffraction into the zero order of the grating may be used to provide output coupling. Additionally, a polarizer might also be included within the cavity to select the polarization of the light at the cavity end of the fiber bundle.

In various embodiments, the laser array 12 may be operated in the c.w. mode or pulse mode.

In order to optimally trim the optical path between the lasers in the array and the reflector, the embodiment shown in FIG. 1 includes optoelectric elements 14a, 16a, 18a and 20a within the cavity. These elements may be controlled individually to adjust the effective optical path provided for light associated with the coupled one of laser devices 14, 16, 18 and 20.

In order to optimize for field pattern of external cavity laser, the output from each fiber can be magnified using conventional optics to nearly fill the near-field or antennas such as used in the microwave field can be scaled to the optical dimensions. An example of such a microwave antenna is the dielectric "polyrod" antenna.

Figure 2:
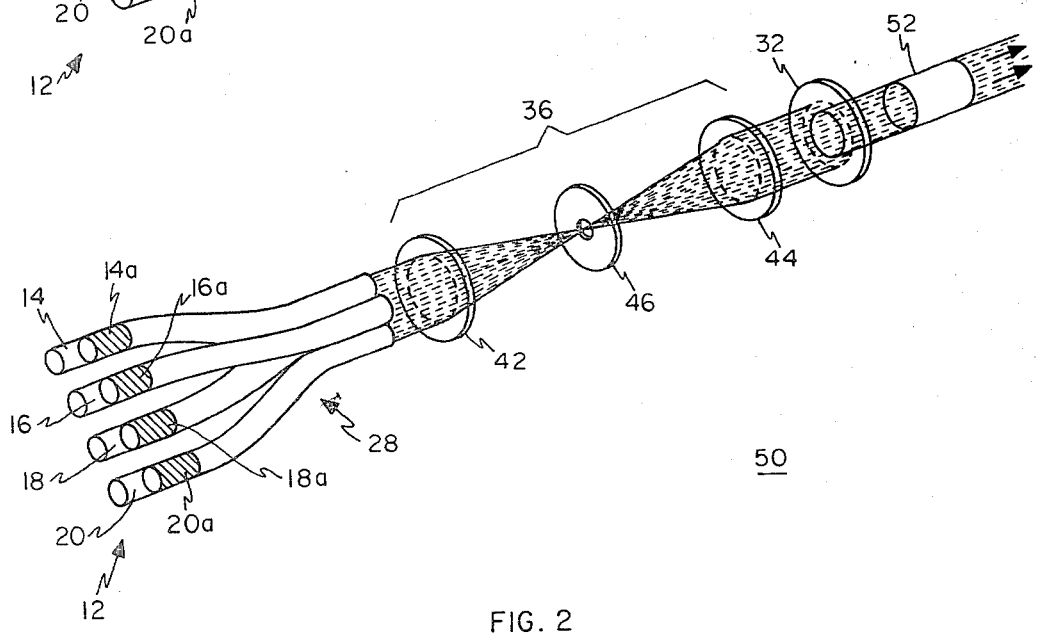

FIG. 2 shows an alternative form of the present invention. In FIG. 2, elements which correspond to elements in the embodiment of FIG. 1 are shown with identical reference designations. The laser 50 of FIG. 2 is similar to laser 10, except that the output beam is passed through a doubler crystal 52, for example, to provide a blue-green output. In the embodiment of FIG. 2, the reflector is an annular flat mirror so that the output beam has a circular cross-section.

The use of the fiber bundle along the optical path between the transmissive ends of the laser devices and the spatial filter permits the laser devices to be positioned remote from the "cavity", thereby permitting reduced power dissipation density in the cavity.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. An external cavity laser, comprising:
   A. an array of semiconductor optical gain elements, each optical gain element including a pair of opposing facets lying along an optical axis, at least one facet of each of said pair of facets being optically transmissive,
   B. a first reflecting means lying across the optical axes for reflecting light incident thereon from said gain elements through each of said one facets back toward each of said one facets,
   C. an array of second reflecting means, each means lying across the optical axis of an associated gain element for reflecting light incident thereon from said associated gain element through said gain elements back toward said one facet, thereby establishing an optical propagation path between the first reflecting means and the second reflecting means,
   D. a first optical fiber bundle including a plurality of optical fibers disposed between said one facet of each gain element and said first reflecting means, each fiber of said first bundle having a first end near and optically coupled to the one facet of each associated gain element, and having a second end oriented with its optical axis substantially parallel to the corresponding ends of the other optical fibers in said first bundle, whereby said fibers of said first fiber bundle establish a portion of the optical propagation path being substantially equal to an integral number of wavelengths of the light generated by the respective ones of said gain elements,
   E. a spatial filter disposed along said optical propagation path between said first fiber bundle and said first reflecting means, said spatial filter including means for receiving light from said first fiber bundle and for transmitting light to said first reflecting means, and means for receiving light from said first reflecting means and transmitting light to said first fiber bundle, said spatial filter including:
      i. a pair of coaxial collimating lenses having optical axes parallel to said propagation path and being spaced apart along their optical axes by the sum of the focal lengths of said lenses, and
      ii. a filter element disposed between said lenses substantially at the mutual focal point of said lenses, said filter element being matched to the Fraunhofer interference pattern associated with the array of fibers at said cavity end of said bundle, whereby the light between said first reflecting means and said second refecting means is spatially coherent, and
   F. output coupling means for tapping a portion of said light between said first reflecting means and said second reflecting means to provide an output beam.

2. A laser according to claim 1 wherein for each gain element said other facet is optically transmissive and further comprising:
   a second optical fiber bundle including a plurality of optical fibers disposed between said other facets and said second reflecting means, each fiber of said second bundle having a first end near and optically coupled to the other facet of an associated one of said gain elements, and having a second end oriented with its optical axis substantially parallel to the corresponding ends of the other optical fibers in said second bundle,
   whereby said fibers of said second bundle establish a portion of said optical propagation path between said other facets and said array of second reflecting means.

3. A laser according to claim 1 wherein the array of said second reflecting means further comprises an array of reflecting means integral with said other facet of each gain element and said one facet is antireflection coated.

4. A laser according to claim 2 wherein said one and other facets of each of said gain elements are anti-reflection coated.

5. A laser according to claims 1 or 2 or 3 or 4 wherein said first reflecting means is a grating in the Littrow configuration.

6. A laser according to claims 1 or 2 further comprising means for dynamically controlling the effective optical length of said fibers.

7. A laser according to claims 1 or 2 wherein said fibers are single mode fibers.

8. A laser according to claims 1 or 2 wherein said fibers are multimode fibers.

* * * * *